United States Patent
Osen et al.

(10) Patent No.: US 10,132,881 B2
(45) Date of Patent: Nov. 20, 2018

(54) MAS-STATOR WITH SUCTIONING-OFF DEVICE

(71) Applicant: Bruker BioSpin GmbH, Rheinstetten (DE)

(72) Inventors: David Osen, Ettlingen (DE); Benno Knott, Karlsruhe (DE); Armin Purea, Bad Schoenborn (DE)

(73) Assignee: Bruker BioSpin GmbH, Rheinstetten (DE)

( * ) Notice: Subject to any disclaimer, the term of this patent is extended or adjusted under 35 U.S.C. 154(b) by 342 days.

(21) Appl. No.: 15/152,573

(22) Filed: May 12, 2016

(65) Prior Publication Data

US 2016/0334478 A1    Nov. 17, 2016

(30) Foreign Application Priority Data

May 13, 2015   (DE) .................. 10 2015 208 850

(51) Int. Cl.
    *G01R 33/30*    (2006.01)
    *G01R 33/44*    (2006.01)

(52) U.S. Cl.
    CPC ......... *G01R 33/307* (2013.01); *G01R 33/302* (2013.01); *G01R 33/44* (2013.01)

(58) Field of Classification Search
    CPC .... G01R 33/307; G01R 33/302; G01R 33/44; G01R 33/34
    USPC ................................................ 324/318, 321
    See application file for complete search history.

(56) References Cited

U.S. PATENT DOCUMENTS

| 4,275,350 | A | | 6/1981 | Hill |
| 4,446,430 | A | * | 5/1984 | Stejskal ............... G01R 33/307 |
| | | | | 324/318 |
| 5,150,054 | A | | 9/1992 | Dupree |
| 7,170,292 | B2 | | 1/2007 | Doty |
| 7,915,893 | B2 | | 3/2011 | Shevgoor |
| 8,212,559 | B2 | | 7/2012 | Armbruster |
| 9,778,331 | B2 | * | 10/2017 | Hunkeler ............. G01R 33/307 |
| 2010/0026302 | A1 | | 2/2010 | Doty |
| 2013/0207656 | A1 | | 8/2013 | Shinagawa |
| 2014/0099730 | A1 | | 4/2014 | Hu |
| 2014/0125340 | A1 | | 5/2014 | Hunkeler |

OTHER PUBLICATIONS

SID Shevgoor et al., "Development of a CryoMAS™ HR-MAS-MAG NMR Probe for High-field WB Magnets", Doty Scientific, Columbia, SC, USA, presented at ENC 2005, Providence, Rhode Island, http://www.dotynmr.com/PDF/CryoMAS ENC05.pdf.

* cited by examiner

*Primary Examiner* — Amy He
(74) *Attorney, Agent, or Firm* — Paul Vincent (57) ABSTRACT

An MAS stator (7) for an NMR-MAS probe head (1) has a bottom bearing (8) with at least one nozzle and at least one radial bearing (9a, 9b), wherein one substantially circular cylindrical MAS rotor (21c) is provided for receiving a measurement substance. The MAS rotor can be supported by compressed gas in a measurement position within the MAS stator by means of a gas supply device and can be rotated about the cylinder axis of the MAS rotor by means of a pneumatic drive. A suction device (100) is provided in a space below the radial bearing for suctioning-off the gas introduced by the gas supply device, and generates an underpressure in the space below the radial bearing during measurement operation. This provides a stator for NMR-MAS spectroscopy in which the closure at the head end of the stator is omitted.

13 Claims, 7 Drawing Sheets

PRIOR ART

Fig. 6

Prior Art

Fig. 7

MAS-STATOR WITH SUCTIONING-OFF DEVICE

This application claims Paris convention priority from DE 10 2015 208 850.2 filed May 13, 2015 the entire disclosure of which is hereby incorporated by reference.

BACKGROUND OF THE INVENTION

The invention concerns an MAS stator for a nuclear magnetic resonance (NMR) magic angle spinning (MAS) probe head comprising a bottom bearing with at least one nozzle and at least one, in particular exactly two, radial bearings, wherein a substantially circular cylindrical MAS rotor is provided for receiving a measurement substance, wherein the MAS rotor can be supported by compressed gas in a measurement position within the MAS stator by means of a gas supply device and can be rotated about the cylinder axis of the MAS rotor by means of a pneumatic drive.

An NMR-MAS probe head of this type is disclosed in DE 10 2013 201 110 B3.

Nuclear magnetic resonance (NMR) spectroscopy is a method of instrumental analysis for determining, in particular, the chemical composition of test samples. In this connection, radio frequency (RF) pulses are irradiated into the test sample which is located in a strong, static magnetic field, and the electromagnetic reaction of the sample is measured.

In solid state NMR spectroscopy, an NMR sample is usually rotated in a tilted position at the so-called "magic angle" of approximately 54.74° with respect to the static magnetic field ("MAS"=Magic Angle Spinning) during spectroscopic measurement in order to reduce line broadening due to anisotropic interactions. To this end, the sample is filled into an MAS rotor. MAS rotors are cylindrical tubes which are closed by one or two caps, wherein the upper one is provided with wing elements ("small impellers").

There are two variants of rotors:
1. The rotor has a blind hole. The open side is closed with the mentioned cap.
2. The rotor has a through hole. These are primarily the so-called "small systems". They comprise the above-mentioned cap at the top and additionally a cap for below having a flat bottom (at least in case of the rotors of the applicant, i.e. the companies of the Bruker group).

The MAS rotor is arranged in an MAS stator and the MAS rotor is driven to rotate by gas pressure via the wing elements. The entity of MAS rotor and MAS stator is called an MAS turbine.

During the NMR measurement, the MAS turbine is arranged in an NMR-MAS probe head. The probe head comprises a cylindrical shielding tube (also abbreviated as "tube") and usually a base box. The tube houses radio frequency (RF) electronic components, in particular RF resonator coils, and the MAS turbine, wherein the MAS turbine is arranged in the area of the end of the tube facing away from the base box. The shielding tube of the probe head is typically inserted from below into the vertical room temperature bore of a superconducting magnet, is positioned and held by means of hooks, supports, screws or the like. The MAS turbine is then located directly in the magnetic center of the magnet.

Exchange of an NMR probe or an MAS rotor filled with a measurement substance using a simple probe head requires removal of the probe head from the magnet, i.e. the probe head must be removed from the room temperature bore. To this end, the user kneels below the magnet, releases the holders and cable connections and collects the probe head when it slides out of the magnet. Pulling out the probe head or also reinsertion of the probe head into the magnet may require a considerable amount of force due to eddy currents induced in the metal parts of the probe head, in particular in the shielding tube, and the dead weight of the probe head. For reasons of safety, the manufacturers of probe heads require that the probe head be removed by two persons together. The rotor can then be manually exchanged on the removed probe head. A rotor change—and therefore new positioning of the probe head in the magnet—normally requires new shimming, which renders this overall procedure relatively complex.

DE 38 18 039 A1 discloses a rotatable sample magazine in the direct vicinity of the MAS stator at the probe head such that the sample in the MAS stator can be changed several times through gas pressure actuation without having to remove the probe head or the sample magazine from the interior of the magnet.

The technical poster of Shevgoor et al. "Development of a CryoMAS™ HR-MAS-MAG NMR Probe for High-field WB Magnets", Sid Shevgoor et al., Doty Scientific, Columbia, S.C., USA, presented at ENC 2005, Providence, R.I., USA, accessible on the Internet on 9 Oct. 2008 at http://www.dotynmr.com/PDF/CryoMAS_ENC05.pdf discloses the use of a lifting system for MAS rotors. A transport line is connected at the end of the tube of a probe head facing away from the base box, which is guided through the room temperature bore of a magnet to the top and out of the magnet. An MAS rotor can be transported through the transport line into the MAS stator of the probe head mounted in the magnet using gas pressure, and an MAS rotor can also be transported in an upward direction out of the MAS stator and out of the probe head.

In order to enable quick change between various MAS rotors, thereby additionally facilitating RF shielding and keeping defined extreme temperature conditions, DE 10 2008 054 152 B3 proposes a probe head with a base box and a tube mounted to and projecting past the base box. The MAS stator for receiving an MAS rotor is disposed within the tube in the region of the end of the tube facing away from the base box. A transport line is provided for pneumatically transferring an MAS rotor within that transport line, the transport line extending in the inside of the tube from the base box to the MAS stator. However, the front bearing of this conventional arrangement does not have an opening which can be closed by means of a closure device for inserting an MAS rotor into the space between the bottom bearing and the front bearing like in a generic probe head of the above-defined type. For this reason, rotor change is not possible in the closed probe head.

In particular, MAS rotors with diameters 1.9 mm require a closure on both sides to stabilize rotation.

In order to automate rotor change, the above cited document DE 10 2013 201 110 B3 proposes a transport line for transferring an MAS rotor of an NMR-MAS probe head by means of which the rotor can be transferred into the stator. As is also disclosed in DE 10 2013 201 110 B3, the stator comprises an additional closure on the head side of the rotor in order to stabilize rotation. Problems are likely to occur, in particular, with MAS rotors having a diameter of less than 2.5 mm, since the Bernoulli force of the bottom bearing is not sufficiently reliable to maintain the rotor in position.

DE 11 2005 002 582 T5 discloses an axial Bernoulli gas bearing for an NMR MAS probe rotor (probe rotary part) driven by gas, in which an inflow having a low rotation component flows to the inside via a conically shaped rotor end. A conical through flow area is formed between this rotor end and a conical stator bearing surface. The stator presented herein is particularly suited for automated rotor change. DE 11 2005 002 582 T2 does not describe whether it is particularly suited for rotors having a small diameter. Gas discharge away from the Bernoulli bearing is also not disclosed.

U.S. Pat. No. 7,915,893 B2 discloses a stator for a CryoMAS sample, in which the measurement coils are temperature-controlled by means of a cooled He finger. The test sample can, however, be measured at a temperature around the room temperature range. This is also a pneumatic drive and for this reason, the spinner is hermetically sealed to prevent the gas supply for drive and bearing from getting into the cooled area of the measurement electronics. In order to prevent this, the gas blown into the stator is again discharged via an exhaust system. The gas discharge can be adjusted to optimize the rotation behavior of the test sample at pressures between 0.5-2 bar (see column 6, lines 32-37). It is, however, not described whether and, if applicable, how the system would be suited for rotors having a very small diameter of less than 3 mm. Rotational speeds of between 2 to 8 kHz or 300 Hz to 30 kHz are also mentioned, which indicates "large" systems. In practice, the smaller rotors are rotated at higher frequencies, wherein the limiting factor is the velocity of sound at the outer surface of the rotor. In practice, the 2.5 mm rotor is operated at approximately 35 kHz, the 1.9 mm rotor at approximately 42 kHz, and the 1.3 mm rotor at 67 kHz.

During the NMR measurement, the MAS rotor is typically supported in the stator using gas bearings in order to reduce the friction losses and thereby achieve the high rotational speeds. At least one radial bearing and one bottom bearing designed as an axial bearing are used for this purpose. Due to the high gas speed in a radial direction, the bottom bearing generates a high dynamic pressure with simultaneous reduction of the static pressure, which generates a force in an axial direction, i.e. the Bernoulli force, which holds the rotor in the stator and makes it float on an air cushion. This, however, occurs in practice only with MAS rotors having a diameter of more than 2.5 mm. This actually theoretically applies to all MAS systems. However, it does not reliably work for smaller systems. This is probably due to the small mass of the rotors and the small retention force due to the small surface of the bottom bearing such that a counter bearing is required as closure.

This problem was solved in the above-mentioned document DE 10 2013 201 110 B3 by providing a closure which can be operated via a sliding mechanism. However, this solution is suitable only to a limited extent, in particular for cooled samples, due to the material properties when the temperature changes, and is moreover quite demanding with respect to implementation and adjustment. This arrangement also requires a large amount of space which is limited, in particular, with respect to SB ("Standard Bore"). It is also obstructive when flipping into the vertical position.

In contrast thereto, it is the underlying purpose of the present invention to provide an NMR-MAS probe head of the above-defined type with stabilized rotation, which does not require the above-mentioned closure means. The system shall be automatable, i.e. allow exchange of the test sample without requiring mechanical closure at the head end of the stator/without having to remove the head from the magnet.

SUMMARY OF THE INVENTION

This object is achieved by an MAS stator of the above-mentioned type which is characterized in that a suction device is provided in a space below the radial bearing for suctioning-off the gas introduced by the gas supply device, and is designed such that it can generate an underpressure with respect to the atmosphere surrounding the MAS stator in the space below the radial bearing during measurement operation.

The present invention provides a stator for NMR-MAS spectroscopy which does not have a closure at the head end of the stator and for this reason, the stator can be fed with the rotor in an easy and easily automatable fashion.

Extraction by suction of the injected gas flow increases the axial force on the rotor directed towards the bottom bearing. The technical effect provided by the suction device consists i.a. in that the rotation properties of the rotors are considerably improved. In particular, smaller rotors (2.5 mm, 1.9 mm, 1.3 mm, 0.7 mm down to 0.2 mm) can therefore be permanently operated without closure, without movement of the rotors in an axial direction which, in the extreme case, would result in ejection of the rotors precisely because the head end does not have a closure.

For this reason, the sample can be changed without removing the closure.

The retention force on the axial bottom bearing due to the Bernoulli effect should theoretically also be sufficient for small rotors. However, in practice, dynamic effects play a role such as e.g. imbalances, transient processes during lifting or interfering frequencies. These effects have an effect on the separation of the rotor from the bottom bearing. In case of larger rotors, the interfering effects are compensated for by the larger mass of the rotors, i.e. the balance of forces with the bearing is achieved more quickly.

The rotor is centered by means of at least one radial bearing. The radial bearing comprises a plurality of gas nozzles, in general 5 to 8 nozzles, which direct gas flow in a radial direction from the outside onto the rotor. In general, the gas nozzles have a diameter of 150-300 µm.

The system also comprises a bottom bearing which directs gas flow in an axial direction onto the planar rotor end or planar bottom cap inserted into the rotor end. The rotor is thus prevented from resting on the bottom surface. At the same time, due to the gas flowing to the outside, the Bernoulli force causes the rotor to be held in position.

In preferred embodiments of the inventive probe head, in which the advantages of the present invention become particularly evident, the MAS stator is designed to receive an MAS rotor having a diameter of 0.2 mm to 2.5 mm, preferably 0.7 mm to 1.9 mm. Up to now, provision of a closure at the head end of an MAS stator in this size range was compulsory.

In practice, embodiments of the invention turn out to be particularly useful, in which the suction device has a gas line for suctioning-off the gas introduced by the gas supply device with a cross-section of 0.2 $mm^2$ to 100 $mm^2$, preferably of 1.5 $mm^2$ to 10 $mm^2$. This is generally sufficient for the volume of the extracted gas flow.

Moreover, in preferred embodiments of the inventive probe head, the suction device is designed in such a fashion that it can be loaded during measurement operation with an underpressure with respect to the atmosphere surrounding the MAS stator of −0.1 bar to −1 bar. The underpressure is preferably at −0.2 bar to −0.4 bar. For this reason, a sufficiently high retention force can be achieved for stable operation without undesired ejection for example for 1.3 mm rotors. The advantage of a small suction pressure is the small power which is required for the suction operation. For larger rotors, one nevertheless still obtains a particularly smooth and stable rotation behavior.

In other preferred embodiments of the invention, a pneumatic sample changing system with a transport line for supplying and discharging an MAS rotor to the MAS stator is provided, which also contributes to automation of the measurement preparations. One advantage of the present invention consists i.a. in that the sample changing system in accordance with DE 10 2008 054 152 B3 can be used in the same way for rotors having a diameter of 0.2 mm to 2.5 mm. Up to now, this has only been possible using a closure device in accordance with the above cited document DE 10 2013 201 110 B3.

In another preferred embodiment, the probe head is formed in the area of the tube as a Dewar flask. The tube is thus designed to be double-walled with a vacuum between the walls. This facilitates temperature control or cooling of the test sample in the probe head for the NMR measurement. Due to the closed design, there are no undesired thermal bridges.

In one class of advantageous embodiments of the inventive MAS stator, the nozzle in the bottom bearing has an inner diameter of between 25 µm and 500 µm, preferably between 80 µm and 200 µm.

A further class of embodiments of the invention having a particularly simple and compact design is characterized in that the device for supplying gas comprises only one single nozzle in the bottom bearing, that nozzle commonly supplying the gas for the pressure gas bearing as well as the gas for the pneumatic drive for rotation of the MAS rotor during operation.

In further preferred embodiments of the inventive MAS stator, a further device is provided for supplying gas to the MAS rotor, by means of which the measurement substance can be kept at a predeterminable operating temperature during measurement operation.

In another advantageous further embodiment, the MAS stator is disposed to be rotatable for adjusting the MAS angle. The rotatability of the stator in the probe head further facilitates insertion and removal of the MAS rotor when space is limited, narrow bends are prevented. Due to the rotatability of the stator, for introducing and discharging, the angle of the stator bearing axis can be reduced with respect to the direction of the longitudinal extension of the tube (which frequently corresponds at least with good approximation to the direction of the static magnetic field in the NMR magnet) and relative to the magic angle.

The present invention also concerns a method for operating a probe head comprising an MAS stator of the above-described type in accordance with the invention, which is characterized in that after positioning the MAS rotor in the MAS stator, the suction device is at first approached before compressed gas is supplied to the bottom bearing such that the MAS rotor remains in the stator and can rotate in a more vibration-free manner.

In one particularly preferred variation of this method, the MAS rotor with measuring substance is removed from its measurement position within the MAS stator after termination of the NMR measurement, in that the underpressure generation at the suction device is switched off, whereas, however, the gas supply device on the bottom bearing is fed with compressed gas such that an overpressure is built up in the space below the radial bearing, which ejects the MAS rotor out of its measurement position.

The advantages of the present invention take effect in a particularly favorable fashion when an MAS rotor having a diameter of 0.2 mm to 2.5 mm, preferably 0.7 mm to 1.9 mm is used in the above-described methods.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is illustrated in the drawing and is explained in more detail with respect to embodiments. In the drawing:

DESCRIPTION OF THE PREFERRED EMBODIMENT

The invention concerns a novel design of the bottom bearing of an MAS stator for an MAS-NMR probe head, in which no closure is provided at the head end of the MAS stator such that sample change is particularly facilitated. Instead, the space below the radial bearing is suctioned by means of a special device.

For better understanding, the previously conventional technology, which is now improved by means of the invention, is first described.

Figure 4:
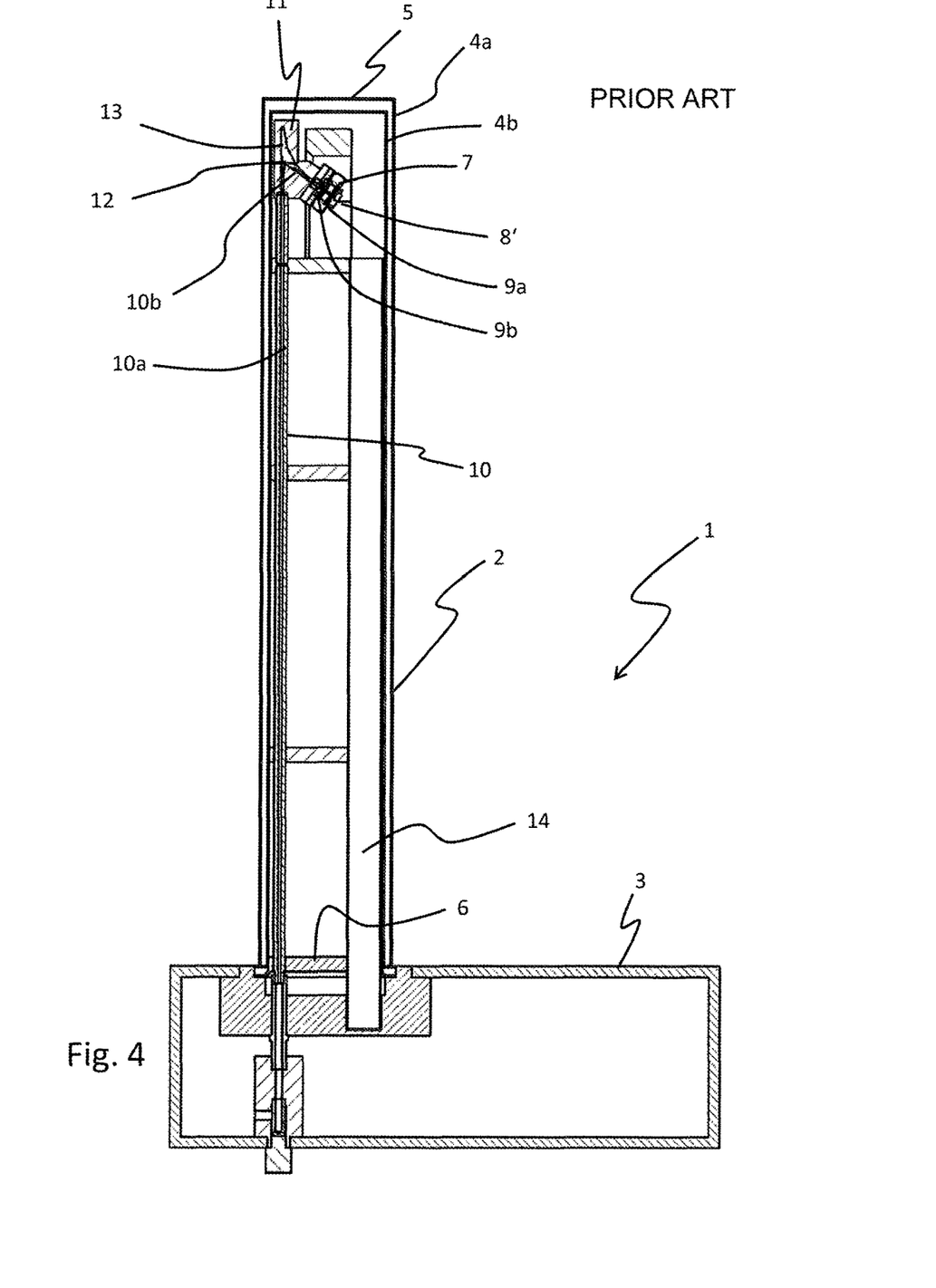
FIG. 4 shows a schematic cross-sectional view of an NMR-MAS probe head in accordance with prior art with a switch point device with branching.

FIG. 4 shows an NMR-MAS probe head 1 according to prior art in a vertical sectional plane. The probe head 1 substantially comprises a tube 2, which is to be inserted into the room temperature bore of a magnet for an NMR measurement, and a base box 3. The tube 2 is mounted to the base box 3. The tube 2 perpendicularly projects past the base box 3b (in the present case). The base box 3 remains outside of the room temperature bore of the magnet. The overall probe head 1 is typically held or mounted via the base box 3, in particular on the magnet or a substructure of the magnet.

In the present case, the tube 2 has a double wall (with an outer wall 4a and an inner wall 4b) between which a vacuum is established such that the tube 2 is simultaneously designed as a Dewar flask for thermal insulation from the (generally room temperature) surroundings. If necessary, temperature-control lines, which are not shown in detail, may extend in the tube 2 in which (in the present case) a coolant, e.g. liquid nitrogen, circulates to cool the inside of the tube 2 including the test sample in an MAS rotor and an NMR measurement electronics, in particular RF resonators in the surroundings of the MAS rotor. Alternatively or additionally, the transport gas flow in the transport line 10 and/or other functional gas flows (see below) can also be cooled, which results (in case of good insulation of the tube 2) in likewise good cooling inside of the tube 2.

At least one wall 4a, 4b of the tube 2 is produced from a metal (e.g. copper) which has good electrical conductivity but is not ferromagnetic. The metallic tube wall shields the tube inner space against outer electromagnetic alternating fields. For this reason, the tube 2 is also called a shielding tube.

The tube 2 is designed to be closed at its upper (in FIG. 4) free end 5 facing away from the base box 3. In particular, no feedthroughs for gas lines or transport lines are provided. Access points to the inside of the tube, e.g. for electric lines, gas lines and transport lines, are exclusively provided in the area of the end 6 of the tube 2 close to the base box.

In the region of its free end 5, the tube 2 contains an MAS stator 7. The stator 7 can hold an MAS rotor (not illustrated in FIGS. 1, 4 and 7) at the magic angle (relative to the longitudinal extension of the tube 2, which is aligned parallel with respect to the static magnetic field during measurement operation) and support it for rotation about the axis of the rotor. At its front face, the stator 7 has a bottom bearing 8 on which the rotor in the stator 7 can be supported (and is thereby supported from below in response to the force of gravity). Two nozzles (not shown in detail) for a bearing gas flow and an ejection gas flow are formed in the bottom bearing 8. The stator 7 moreover has a first lower radial bearing 9a close to the bottom bearing 8 and also a second opposite upper radial bearing 9b, in each of which one opening is formed for feedthrough of the rotor. The bottom bearing 8 and the first radial bearing 9a face the base box 3 and the second radial bearing 9b faces away from the base box 3. The magnetic center of the magnet arrangement in the NMR measurement is in the center between the first and the second radial bearing 9a, 9b. The stator 7 has gas nozzles which are not shown in detail, by means of which an inserted rotor can be subjected to gas flow and set into rotation.

Moreover, a transport line 10 for MAS rotors extends in the inside of the tube 2. A first section 10a of the transport line 10 extends from the end 6 of the rotor 2 close to the base box past the stator 7 to a switch point device 11. A second section 10b of the transport line 10 extends from the switch point device 11 to the stator 7. The set point device 11 comprises a blind hole section 13 and a branching 12 of the transport line 10 (see in this case also FIG. 4). The transport line 10 is generally formed by flexible hoses and/or rigid tubes and can also contain curved sections (curves) in addition to straight sections taking into consideration the size of the MAS rotors and the play of the rotors in the transport line 10. The rotors are pneumatically advanced by gas pressure and/or the force of gravity in the transport line 10.

A robust frame 14 is furthermore formed in the inside of the tube 2, on which the stator 7 and diverse electronic components (not shown separately) for an NMR measurement are arranged on a test sample arranged in the stator. In this case, the first section 10a of the transport line 10 is designed as a rigid tube which improves the stability of the frame 14. Some electronic components are thereby directly mounted to the section 10a (not shown separately).

Figure 1:
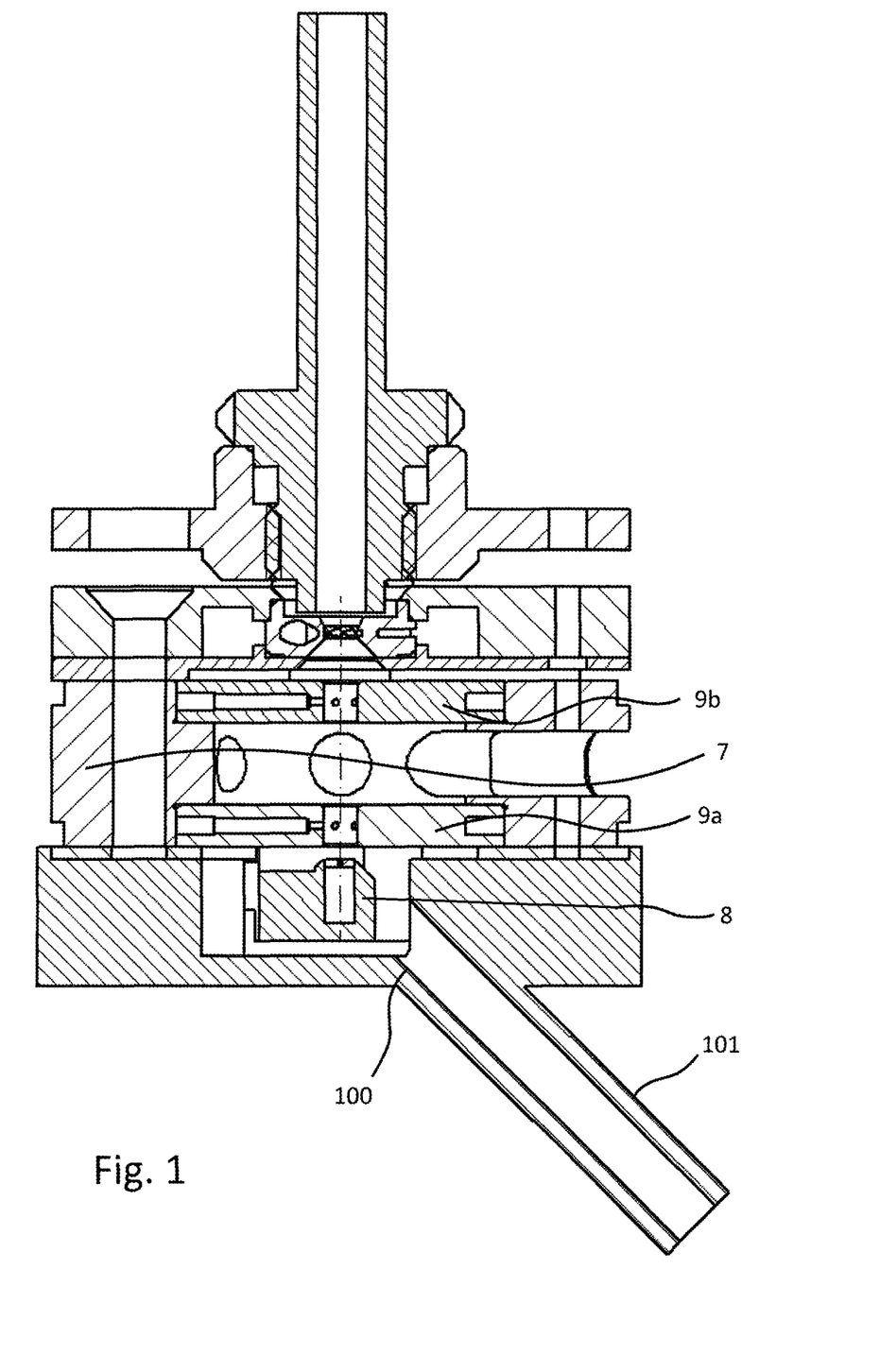
FIG. 1 shows a schematic cross-sectional view of an embodiment of the inventive NMR-MAS probe head without MAS rotor.
Figure 5:
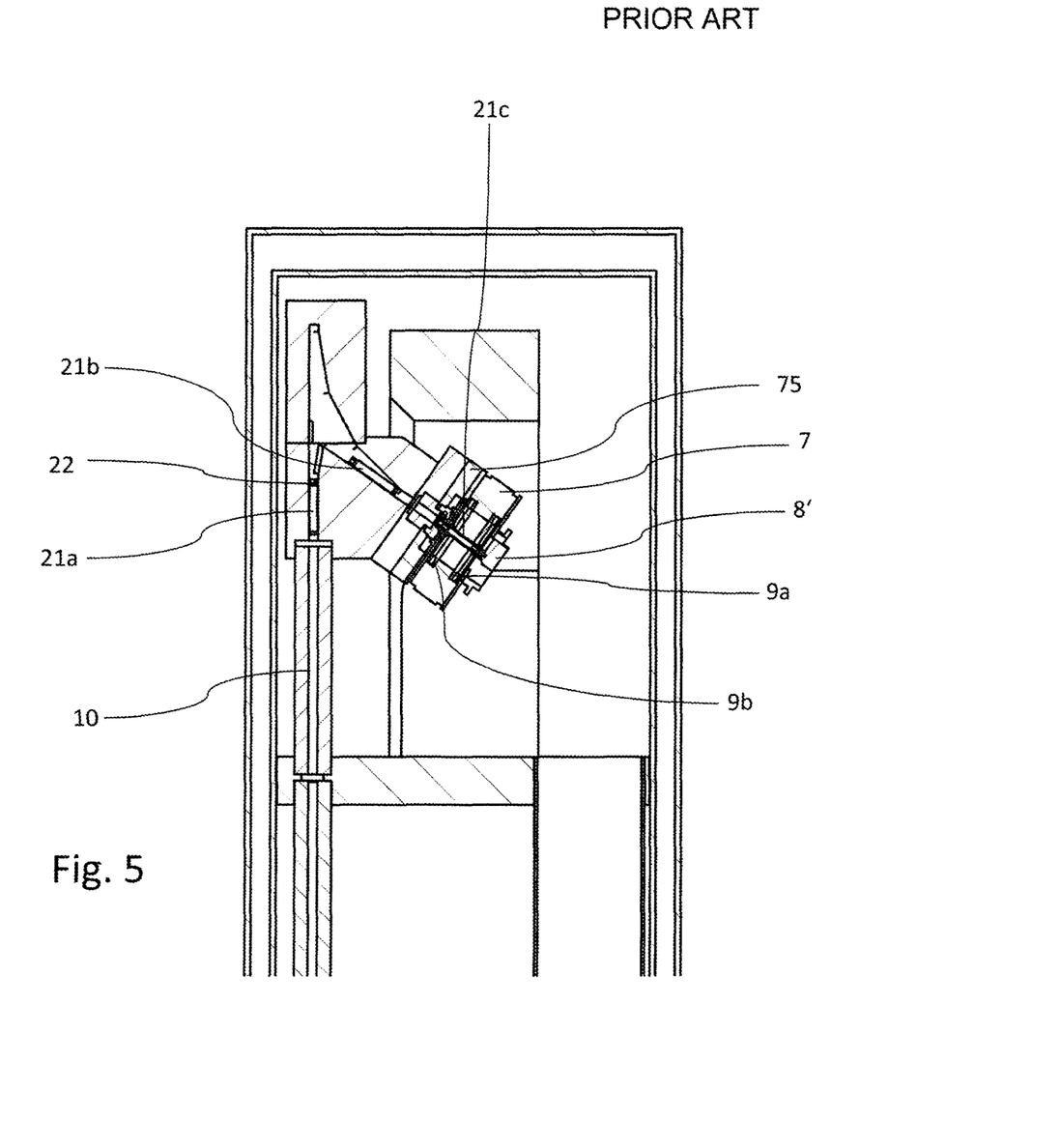
FIG. 5 shows an enlarged view of the free end of the tube of the probe head of FIG. 4.
Figure 7:
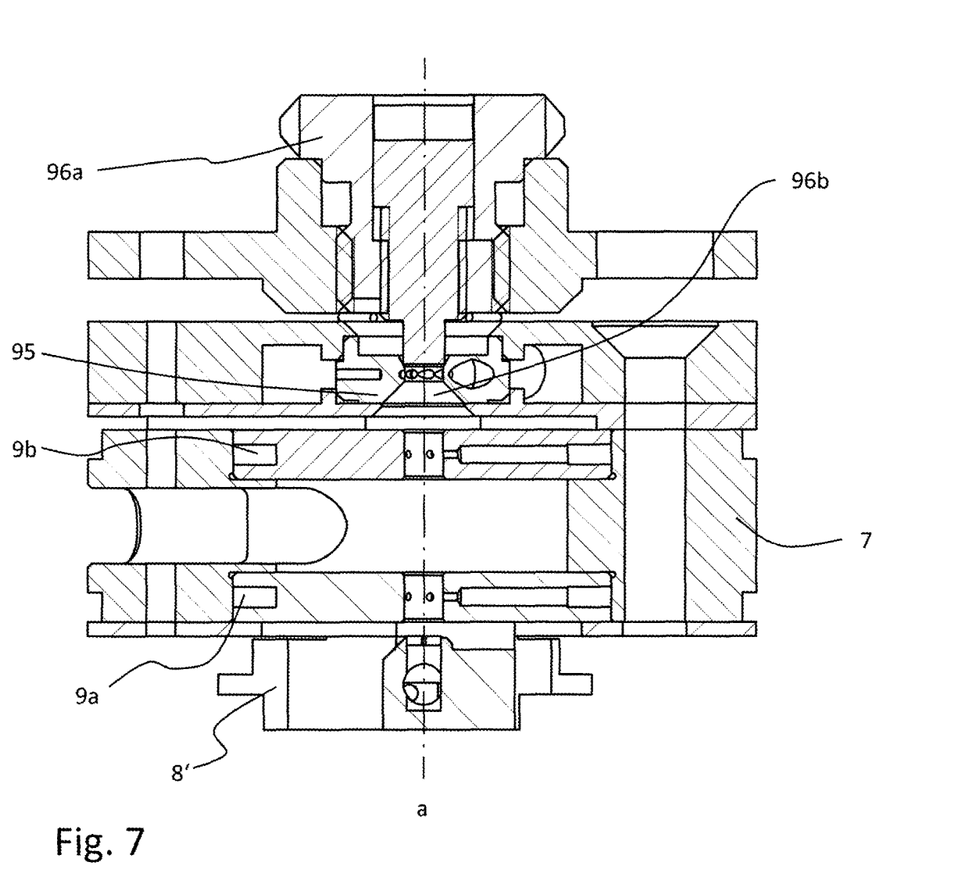
FIG. 7 shows a schematic sectional view of a probe head according to prior art comprising the above defined features and a front bearing which can be manually screwed on and off for introducing or removing the rotor.

FIG. 5 shows insertion of an MAS rotor 21a, 21b, 21c into the MAS stator 7 of the probe head in accordance with FIG. 1 or 7 in detail. The illustrations 21a, 21b, 21c of the rotor concern different stages of insertion.

Using a gas flow, a rotor 21a is initially advanced through the first section 10a of the transport line in an upward direction towards the switch point device 11. The cap 22 of the rotor 21a thereby faces in an upward direction. Wing elements (impellers) are formed on this cap 22 (not visible in FIG. 6).

The gas flow applied from below forces the rotor 21a in an upward direction into the blind hole section 13. The gas flow then flows from the section 10a through the branching 12 into the second section 10b of the transport line to the stator 7. This gas flow then blows the rotor 21b in the direction of the second section 10b, i.e. the rotor 21b is pivoted with its lower bottom end towards the right hand side and is lowered again. The rotor 21c is finally forced by the gas flow towards the MAS stator 7 to the right hand lower side in the second section 10b and into the stator 7. During this maneuver, the transport line includes reversal (turning maneuver).

A reverse gas flow is applied for discharging the rotor 21c from the stator 7. This gas flow initially forces the rotor 21c from the stator 7 through the second section 10b into the blind bore section 13. Then a gas flow is established from the second section 10b of the transport line through the branching 12 into the first section 10a of the transport line. This gas flow pulls the rotor 21b in the direction of the first section 10a and finally into it such that the rotor 21a is moved back through the first section 10a of the transport line to the base box. Also in this case, the transport line includes reversal (turning maneuver).

The switch point device 11, which is located beyond (behind) the MAS stator 7 as viewed from the base box, can replace a 180° curve in the transport line via the turning maneuver and at the same time provide access to the MAS stator 7 from the side facing away from the base box through the second radial bearing 9b (in FIG. 5 from the top). Without the switch point device 11, the rotor would have to be guided around a narrow bend of at least 180°−54.7°=125.3° in order to be able to be transported from the vertical first section 10a of the transport line to the stator 7 inclined by the magic angle, and back. Since the possible radius of curvature of a transport line is limited by the dimensions of the rotor, a narrow bend of this type would require a substantial amount of space in the tube of the probe head. By avoiding the narrow bend, the tube may have a small inner diameter ID such that an inventive probe head can be inserted even into small room temperature bores of magnet arrangements. In the embodiment illustrated in FIG. 5 there is only a slight curve of 54.7° in the area of the second section 10b of the transport line. In accordance with the invention, the outer diameter of the tube can be easily limited to 40 mm or 73 mm for normal room temperature bores.

Figure 6:
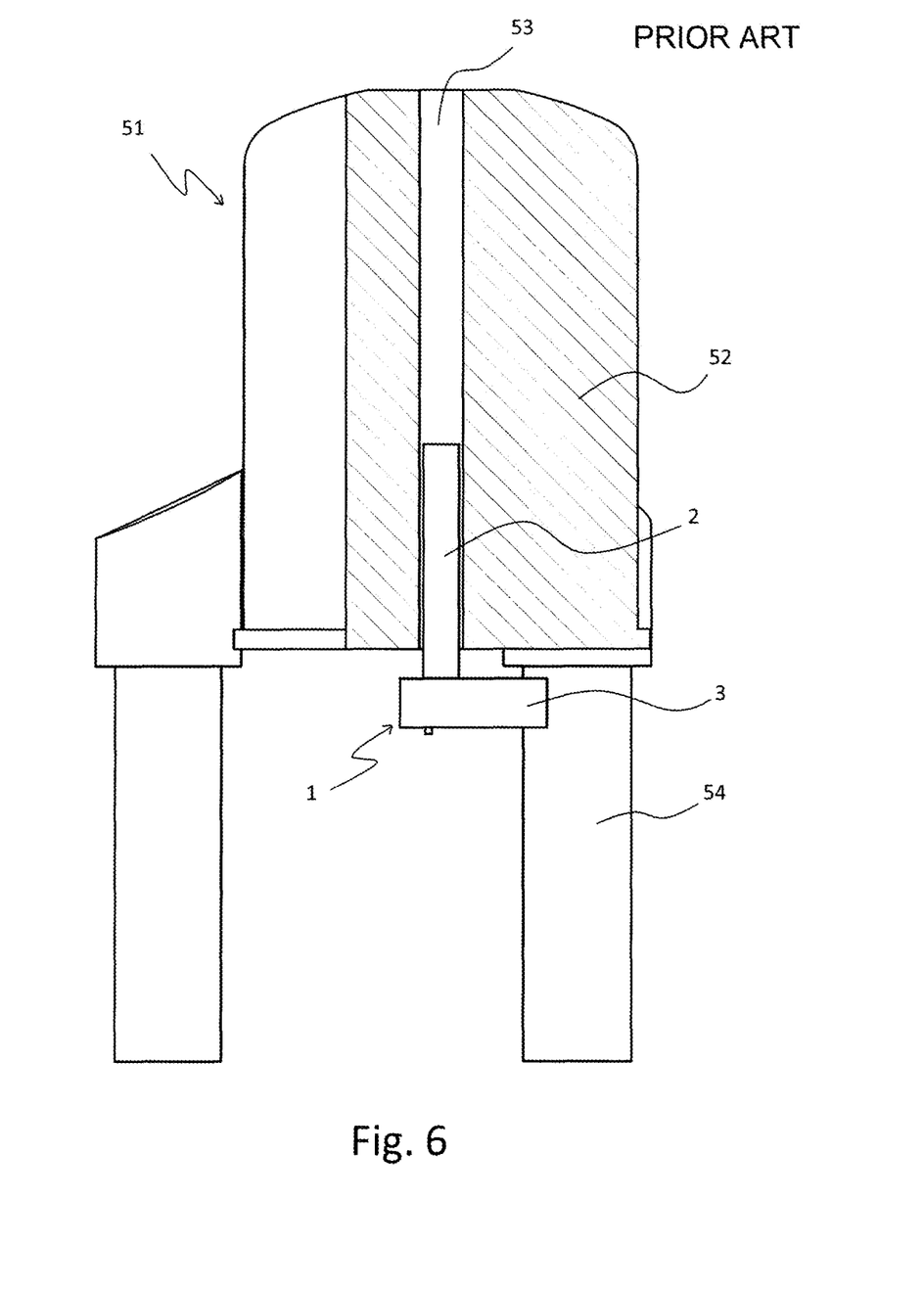
FIG. 6 shows a schematic cross-sectional view of an NMR apparatus in accordance with prior art with the probe head in accordance with the invention being inserted from below into the room temperature bore of the magnet.

FIG. 6 shows a modified NMR apparatus 51 comprising a superconducting magnet arrangement 52 (in the present case comprising solenoid-shaped superconducting magnet coils which are not shown in detail) with a vertical room temperature bore 53. The magnet arrangement 52 is supported on robust supports 54. An inventive NMR-MAS probe head 1 (see FIG. 4) is inserted from below into the room temperature bore 53. The major part of the tube 2 of the probe head 1 lies within the room temperature bore 53, whereas the base box 3 of the probe head 1 is arranged outside of the room temperature bore 53 below the magnet arrangement 52.

FIG. 7 shows a schematic detailed section of a generic MAS stator according to prior art which comprises the above defined features, but precisely not those features specific to the invention, and comprises a front bearing 96a which can be manually screwed on and off for introducing or removing the rotor into or from the space within the MAS stator 7 between bottom bearing 8 and front bearing 96a. When the front bearing 96a is screwed on, the opening 96b is always closed such that automated loading and unloading of the rotor is not possible. Rather, the rotor must always be introduced or removed by hand.

Figure 2:
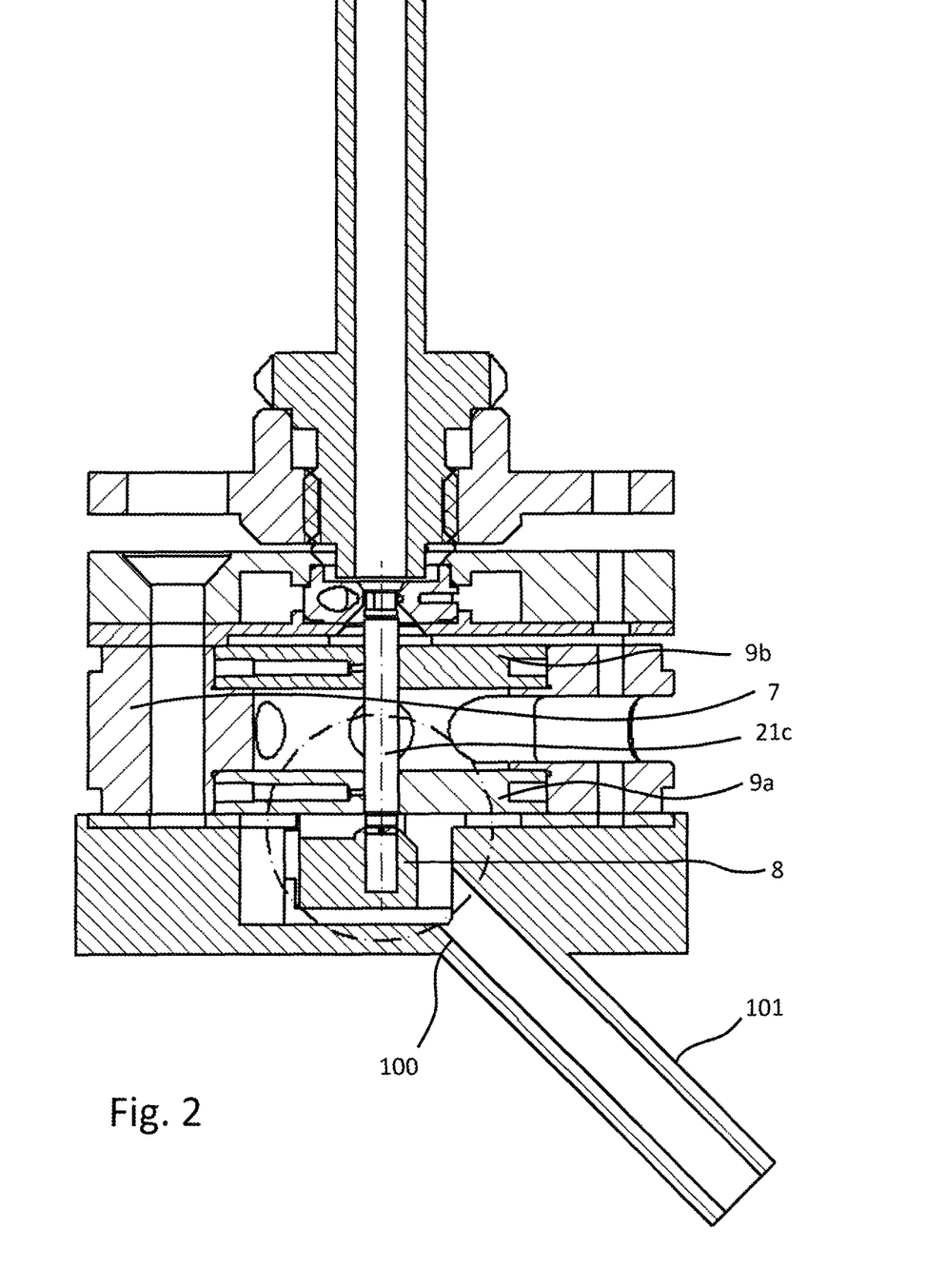
FIG. 2 like FIG. 1 but with inserted MAS rotor.
Figure 3:
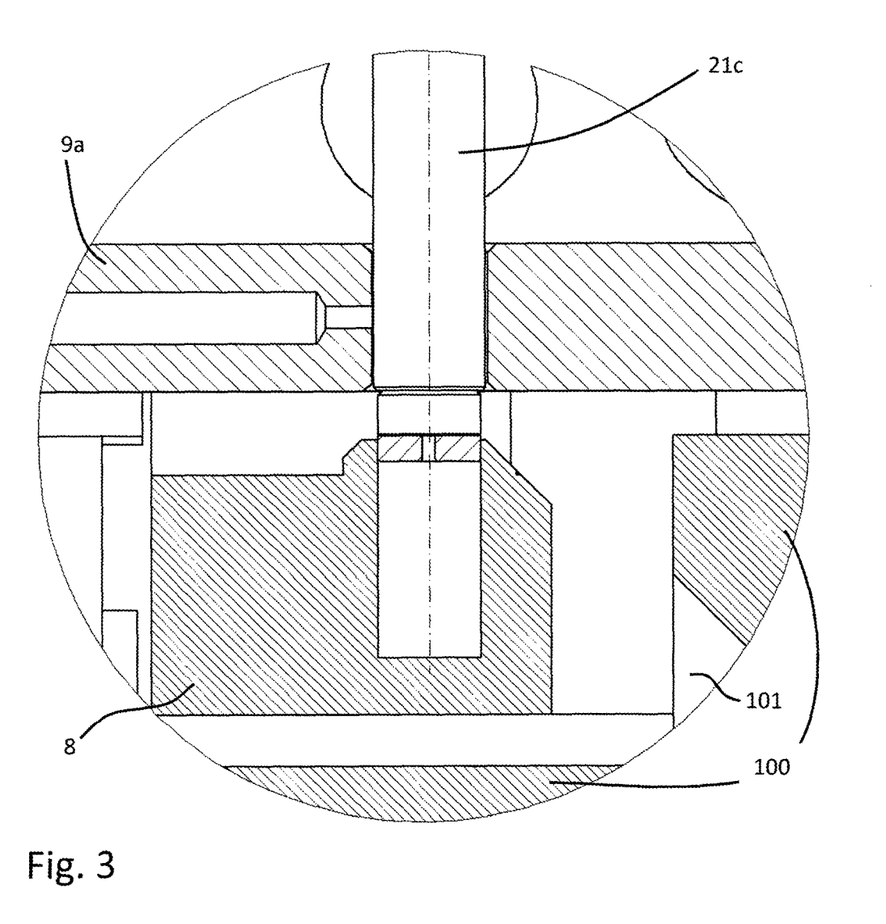
FIG. 3 shows an enlarged detailed view of FIG. 2 in the region of the bottom bearing with nozzle.

FIGS. 1 to 3 schematically show different details of an embodiment of the inventive probe head:

Like the stator according to prior art, the illustrated MAS stator 7 has a bottom bearing 8 with at least one nozzle and at least one radial bearing 9a; 9b, wherein a substantially circular cylindrical MAS rotor 21c is provided for receiving a measuring substance, which is supported by compressed gas by means of a gas supply device in a measurement position within the MAS stator 7 and can be rotated about the cylinder axis of the MAS rotor 21c by means of a pneumatic drive.

In accordance with the invention, the MAS stator 7 illustrated in FIGS. 1 to 3 is characterized in that a suction device 100 is provided in a space below the radial bearing 9a for suctioning-off the gas introduced by the gas supply means, and is designed in such a fashion that it can generate an underpressure with respect to the atmosphere surrounding the MAS stator 7 in the space below the radial bearing 9a during measurement operation.

The MAS stator 7 for receiving an MAS rotor 21c has a diameter of 0.2 mm to 2.5 mm, preferably 0.7 mm to 1.9 mm.

The suction device 100 has a gas line 101 which is used to suction-off the gas introduced by the gas supply means and which has a cross-section of 0.2 mm$^2$ to 100 mm$^2$, preferably 1.5 mm$^2$ to 10 mm$^2$.

The radial bearings 9a, 9b as well as the bottom bearing 8 are preferably fed via a common compressed gas line. As an alternative, a plurality of lines may be used. The injection pressure is 0 to 5 bar relative to the ambient pressure.

For driving the turbine, a further gas flow is directed onto the rotor blades at the head end of the rotor 21c. This flow is advantageously directed in a tangential direction onto the rotor blades to rotate them. The drive gas flow may amount to 5 bar relative to the ambient pressure.

In order to ensure that this system can also be used for small rotors having a diameter ≤2.5 mm, the system furthermore comprises an extraction line at the bottom end of the stator. The function of this line consists in removing the introduced gas at a reduced relative pressure (approximately −0.1 to −1 bar). The gas flow of the Bernoulli bottom bearing is substantially suctioned, but also parts of the gas flow of the lower radial bearing are discharged to the bottom. In this way, the gas flow in the surroundings of the bottom bearing is changed which results in an improved retention force in the bottom bearing.

A further gas flow may optionally be supplied to the rotor, which is used for selective temperature control of the test sample. The stator advantageously comprises two radial bearings, which further stabilizes the rotor. The separation between the radial bearing and the rotor is 5 to 50 μm, advantageously 10 to 30 μm. The separation between the bottom bearing and the rotor is advantageously 5 to 25 μm. The extraction hose should have a diameter of at least 0.5 mm.

We claim:

1. An MAS stator for an NMR-MAS probe head, the stator structured to cooperate with a substantially circular cylindrical MAS rotor having a cylinder axis, the MAS rotor structured for receiving a measurement substance, the stator comprising:
    a bottom bearing with at least one nozzle and at least one radial bearing;
    a gas supply device structured to support the MAS rotor with compressed gas in a measurement position within the MAS stator;
    a pneumatic drive structured to rotate the MAS rotor about the cylinder axis thereof; and
    a suction device, said suction device disposed in a space below said radial bearing and structured for suctioning-off gas introduced by said gas supply device, wherein said suction device is designed to generate an underpressure with respect to an atmosphere surrounding the MAS stator in said space below said radial bearing and during measurement operation.

2. The MAS stator of claim 1, wherein the MAS stator is designed to receive an MAS rotor having a diameter of 0.2 mm to 2.5 mm or of 0.7 mm to 1.9 mm.

3. The MAS stator of claim 1, wherein said suction device has a gas line for suctioning-off gas introduced by said gas supply device, said gas line having a cross-section of 0.2 mm$^2$ to 100 mm$^2$ or of 1.5 mm$^2$ to 10 mm$^2$.

4. The MAS stator of claim 1, wherein said suction device is structured to accept an underpressure load during measurement operation with respect to the atmosphere surrounding the MAS stator of −0.1 bar to −1 bar.

5. The MAS stator of claim 1, wherein said nozzle in said bottom bearing has an inner diameter of between 25 μm and 500 μm or of between 80 μm and 200 μm.

6. The MAS stator of claim 1, wherein said gas supply device comprises only one single nozzle in said bottom bearing, that nozzle commonly supplying gas for a pressure gas bearing as well as gas for said pneumatic drive for rotation of the MAS rotor during operation.

7. The MAS stator of claim 1, further comprising an additional device for supplying gas to the MAS rotor in order to keep the measurement substance at a predeterminable operating temperature during measurement operation.

8. The MAS stator of claim 1, wherein the MAS stator is structured to rotate for adjusting an MAS angle.

9. A probe head comprising the MAS stator of claim 1, further comprising a pneumatic sample changing system having a transport line for supplying and discharging the MAS rotor to the MAS stator.

10. The probe head of claim 9, wherein, when said suction device is switched off, said nozzle in said bottom bearing is a component of said pneumatic sample changing system by means of which the MAS rotor can be ejected from the MAS stator.

11. A method for operating the probe head of claim 9, wherein, after positioning the MAS rotor in the MAS stator, said suction device is initially started before compressed gas is supplied to said bottom bearing such that the MAS rotor remains in the MAS stator and can rotate in a more vibration-free manner.

12. The method of claim 11, wherein, after termination of an NMR measurement, underpressure generation by said suction device is switched off, said gas supply device supplies compressed gas to said bottom bearing and an overpressure is built up in said space below said radial bearing thereby ejecting the MAS rotor out of the measurement position.

13. The method of claim 11, wherein the MAS rotor has a diameter of 0.2 mm to 2.5 mm or of 0.7 mm to 1.9 mm.

* * * * *